United States Patent [19]
Sooy et al.

[11] Patent Number: 5,898,983
[45] Date of Patent: May 4, 1999

[54] ELECTRIC COMPONENT INSERTION APPARATUS

[75] Inventors: Robert J. Sooy, Marblehead, Mass.; Rodney Peter Jackson, Auburn, N.H.

[73] Assignee: TDK Corporation of America, Mount Prospect, Ill.

[21] Appl. No.: 08/778,470

[22] Filed: Jan. 3, 1997

Related U.S. Application Data

[60] Provisional application No. 60/009,666, Jan. 5, 1996, and provisional application No. 60/021,471, Jul. 10, 1996.

[51] Int. Cl.$^6$ ............................. B23P 23/00; H05K 3/32
[52] U.S. Cl. ............................. 29/33 M; 29/739; 29/741
[58] Field of Search ............................. 29/546.6, 564.2, 29/564.8, 741, 739, 566.2, 33 K, 753, 33 M; 227/85; 140/105

[56] References Cited

U.S. PATENT DOCUMENTS

| | | | |
|---|---|---|---|
| 4,177,549 | 12/1979 | Mori et al. | 29/564.2 |
| 4,196,513 | 4/1980 | Harigane | 29/741 |
| 4,205,433 | 6/1980 | Araki et al. | 29/741 X |
| 4,312,109 | 1/1982 | Kawana et al. | 29/564.6 |
| 4,366,421 | 12/1982 | Eto et al. | 74/813 C |
| 4,370,804 | 2/1983 | Misawa et al. | 29/741 |
| 4,574,660 | 3/1986 | Kaminsky et al. | 74/822 |
| 4,622,740 | 11/1986 | Mirley, Jr. et el. | 29/741 |
| 4,635,341 | 1/1987 | Staudinger | 29/566.3 |
| 4,670,977 | 6/1987 | Scrantom et al. | 29/33 M |

*Primary Examiner*—William Briggs
*Attorney, Agent, or Firm*—Darby & Darby

[57] ABSTRACT

An insertion machine of the type used to form and insert the lead-wires of an electronic component into openings of a printed circuit board insertion machine comprising a frame and a head assembly. The head assembly receives an electronic component and includes means for forming the lead-wires into a predetermined shape and means for inserting the lead-wires into the openings of the printed circuit board. A clinching assembly is positioned below the head assembly and includes means for trimming the lead-wires and means for clinching the lead-wires. A work-support table for holding the printed circuit board is rotatable about a vertical axis and is positioned between the clinching assembly and the head assembly.

8 Claims, 12 Drawing Sheets

ELECTRIC COMPONENT INSERTION APPARATUS

The application claims the benefit of provisional application Ser. No. 60/009,666, filed Jan. 5, 1996 and provisional applicatin Ser. No. 60/021,471, filed Jul. 10, 1996.

BACKGROUND OF THE INVENTION

1. Field of the Invention

The present invention relates to machinery for securing wire terminals to planar work pieces, and particularly, to equipment for inserting and securing electronic components to printed circuit boards (PC boards) by cutting and clinching the lead wires of such electronic components.

2. Prior Art

Mass-produced printed circuit boards common in the electronics industry are circuit-prepared insulative substrates provided with preformed openings. Each opening is carefully positioned and adapted to receive one lead-wire of a variety of electronic components, including resistors, capacitors, transistors, etc. which are intended to be electrically interconnected with the printed circuit formed on the insulative substrate.

It has been found that such electrical components can be quickly and economically inserted into the appropriate openings of the PC board through the use of automatic equipment called "inserters" or insertion machines. A typical insertion machine includes three basic mechanical assemblies which are all connected to a common frame; a head assembly, a work-support assembly, and a clinching assembly. An insertion machine is programmed to rapidly form (or otherwise prepare) the lead wires of various electrical components as they are supplied from adjacent supply bins, cartridges, or from a pre-sequenced supply ribbon and position and insert the lead wires into the proper openings of the PC board. The head assembly, the work-support assembly, and the clinching assembly of a typical insertion machine function together similar to the operation of a desk-top stapler which secures staples to a sheet of paper, wherein each "staple" is analogous to a prepared electrical component and the sheet of "paper" is analogous to a PC board. A PC board is secured to a work-support table. The work-support table, which is usually selectively pivotal, is positioned between the head assembly and the clinching assembly. The head assembly and the work-support table move with respect to each other during operation of the inserter machine to properly align and insert the lead wires of each electrical component into the proper pre-assigned openings of the PC board. The head assembly includes a "lead-former" sub-assembly which is used to cut an individual electrical component from a supply ribbon, for example, and bend the lead wires (assuming an axial-type lead wire arrangement) into a predetermined shape. A pusher sub-assembly called a "driver", which is also located within the head assembly, pushes prepared (formed) electrical components from the lead-former sub-assembly through the properly aligned openings of the PC board.

Prior art insertion machines typically utilize pneumatic linear actuators or motor-driven lead screw assemblies to provide the downward linear motion required to move the driver sub-assembly into contact with a formed electrical component and force it towards the PC board which is secured to the work-support table. Among the problems associated with pneumatic-type actuators of prior art insertion machines include noise, speed limitations and a need for auxiliary means to accommodate varying component body and lead wire diameters. The problems associated with using lead-screw type actuators of prior art insertion machines include the expense of manufacturing and implementing the lead screw components and the difficulty of interfacing the lead screw with certain indexing features.

After each of a pair of lead wires of a particular electrical component is inserted into its respective openings on the PC board, the clinching assembly cuts excess lead wire material and clinches the remaining lead wire portions of the particular electrical component to the PC board to ensure that accurate, reliable and "clean" electrical connections are established.

When all of the desired electrical components are clinched to the PC board in their proper openings, the PC board is removed from the work-support table and moved to undergo subsequent manufacturing processes, including a reflux process during which molten solder is applied to the underside of the PC board to permanently and electrically bond the clinched portions of each lead wire of each electrical component to the actual printed circuit.

The head assemblies of component insertion machines of the type generally described above and under consideration in the present invention are described, for example, in U.S. Pat. No. 3,550,238, U.S. Pat. No. 4,553,323 and U.S. Pat. No. 4,719,810. These patents disclose inserters that are pneumatically and/or servo actuated.

Examples of work-support tables of component insertion machines of the type generally described above and under consideration in the present invention are described in U.S. Pat. No. 4,670,977, U.S. Pat. No. 4,193,186, and U.S. Pat. No. 4,574,660. Examples of clinching devices of component insertion machine of the type generally described above and under consideration in the present invention are described in U.S. Pat. No. 4,584,758, U.S. Pat. No. 4,292,727.

All patents identified herein are hereby incorporated by reference.

It is an object of the present invention to provide an electronic component inserter machine which overcomes the deficiencies of the prior art.

It is another object of the invention to provide a head assembly for use with an electronic component inserter machine which overcomes the deficiencies of prior art head assemblies.

It is another object of the invention to provide a work-support table for use with an electronic component inserter machine which overcomes the deficiencies of prior art work-support tables.

It is another object of the invention to provide a clinching assembly for use with an electronic component inserter machine which overcomes the deficiencies of prior art clinching devices.

It is yet another object of the invention to provide a head assembly having a simple linear drive mechanism which provides smooth reciprocating linear motion to a driver sub-assembly.

It is yet another object of the invention to provide such a linear drive mechanism which concurrently drives a component supply ribbon feed mechanism.

It is yet a further object of the invention to provide a pivotal worksupport table which includes a fast, simplified, and accurate indexing system.

It is yet a further object of the invention to provide a clinching device which automatically determines the present of the leads of an electrical component located within an opening during a cutting operation.

SUMMARY OF THE INVENTION

The present invention is directed to an insertion machine of the type used to form and insert the lead-wires of an electronic component into openings of a printed circuit board. The insertion machine includes a frame and a head assembly. The head assembly receives an electronic component and includes means for forming the lead-wires into a predetermined shape and means for inserting the lead-wires into the openings of the printed circuit board. A clinching assembly is positioned below the head assembly and includes means for trimming the lead-wires and means for clinching the lead-wires. A work-support table for holding the printed circuit board is rotatable about a vertical axis and is positioned between the clinching assembly and the head assembly.

DETAILED DESCRIPTION OF THE PREFERRED EMBODIMENTS

A. Inserter Machine

Figure 1A:
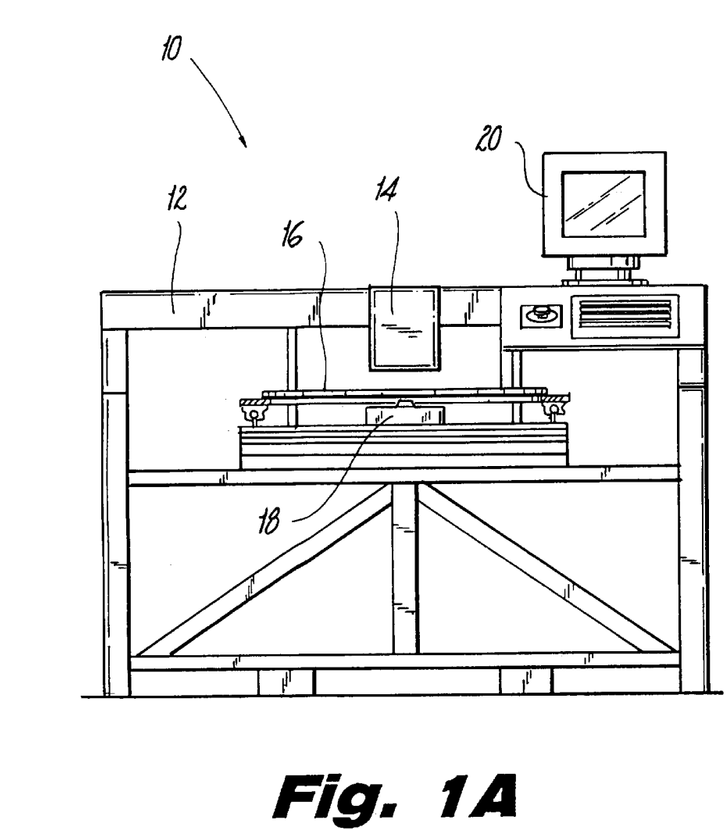
FIG. 1A is a front elevation view showing a insertion machine, in accordance with the invention.
Figure 1B:
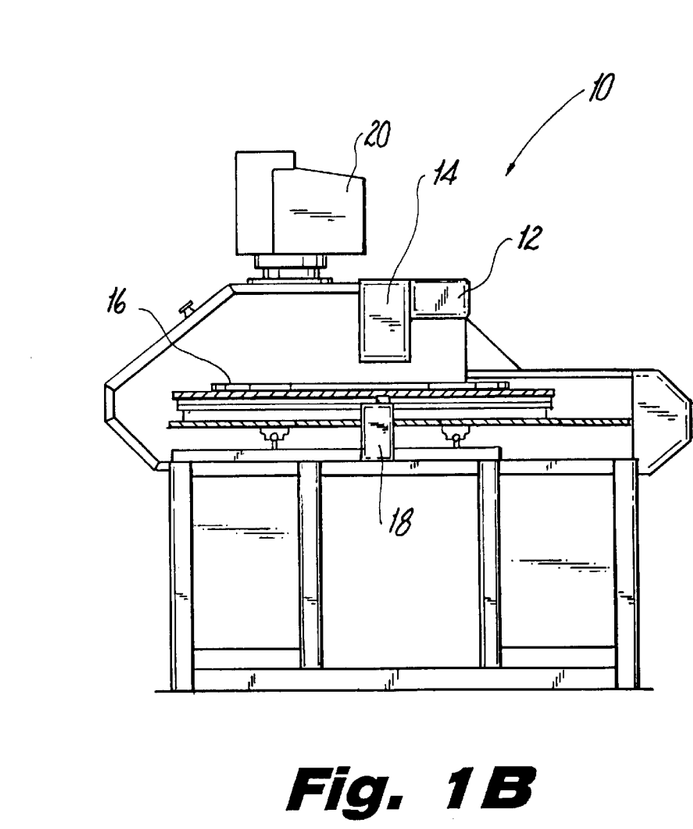
FIG. 1B is a side elevation view of the insertion machine of FIG. 1A, in accordance with the invention.
Figure 1C:
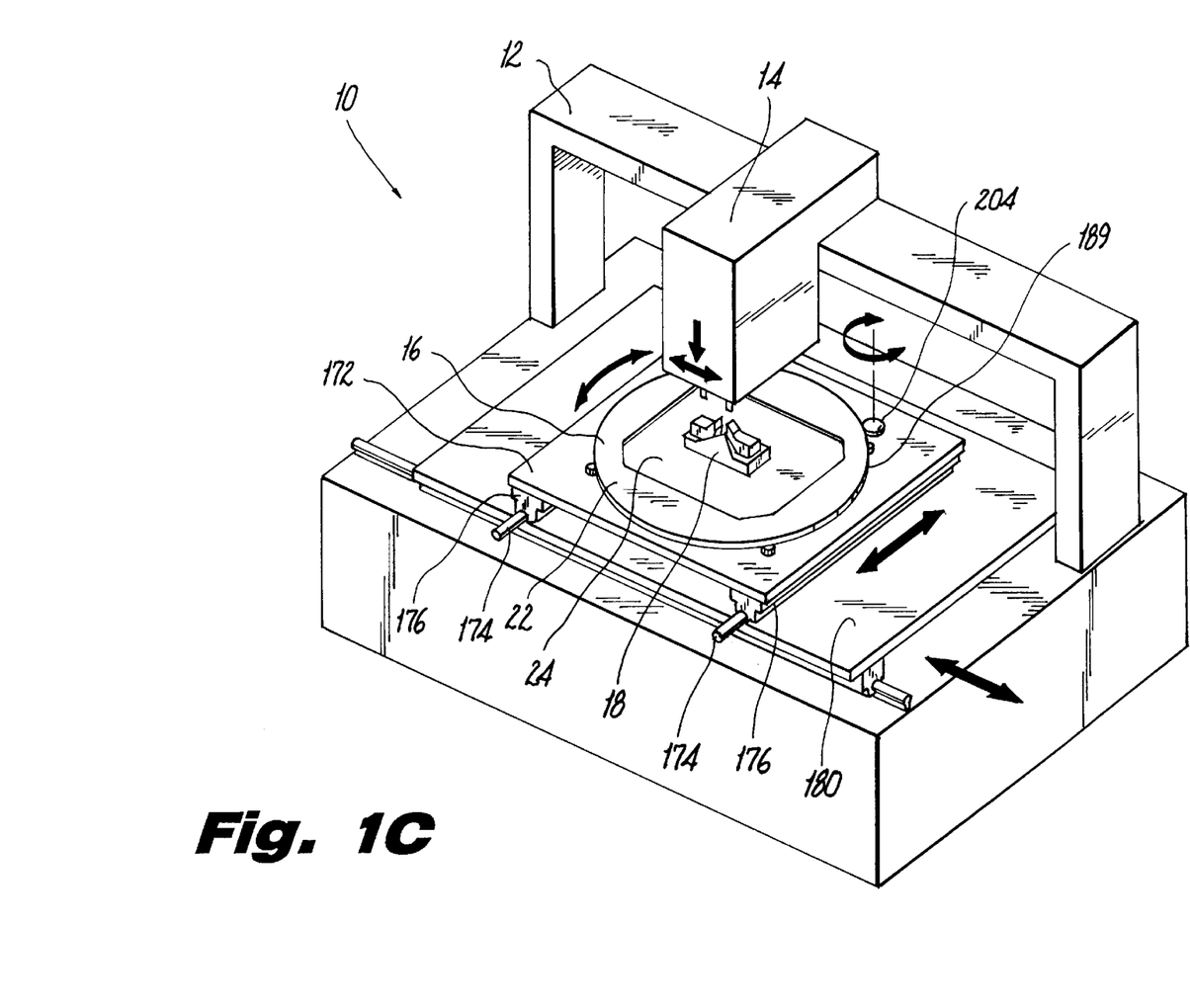
FIG. 1C is a perspective view of the insertion machine, in accordance with the invention.

Referring to FIG. 1, an electrical component insertion machine 10, in accordance with the invention, is shown including a frame 12, a head assembly 14, a work-support table 16, a clinching assembly 18, and a computer terminal 20.

Head assembly 14 is preferably rigidly attached to frame 12 and is positioned directly above work-support table 16, defining a reference point of insertion, and a vertical axis of insertion (Z-axis). The reference point of insertion is the exact insertion point of an electronic component. The vertical axis of insertion (Z axis), defines the path of a particular electrical component during the operation of insertion. Head assembly 14 is preferably adapted to receive a pre-formed ribbon or tape holding a particular sequence of electronic components. Alternatively, individual components from adjacent supply bins or cartridges may be provided to the head assembly. Head assembly 14 described and shown is of the type adapted to receive a supply tape of electronic components, in particular, axial-lead type electronic components, such as most resistors and certain capacitors.

The supply tape is made up of a series of electronic components to be inserted in a predetermined order. The components are sequentially spaced apart with the axial leads parallel to the lead of adjacent components. The end portion of each axial lead wire is secured to a length of folded adhesive tape. The lead wires are evenly spaced apart from adjacent electronic components to define a supply tape pitch.

Head assembly 14 receives the supply tape and removes (through cutting) each electronic component individually and sequentially from the supply tape. Once a component is removed, head assembly 14 bends each of its lead wires downward so they become parallel to each other and drives the lead wire ends into openings located on a mounted PC board. An index wheel arrangement, described below, engages the supply tape and advances the electronic components into head assembly 14 as necessary.

Work-support table 16 (described in greater detail below) is attached to frame 12 and includes an upper surface 22. Upper surface 22 is preferably perpendicular to the Z axis, and includes large opening 24 across which a PC board (or several PC boards) may be secured. Work-support table 16 includes an independently actuated X-axis displacement drive system 26 and an independently actuated Y-axis displacement drive system 28, as is well known in the art (see, for example, U.S. Pat. No. 4,670,977, hereby incorporated by reference). Each coordinate displacement drive system 26, 28 provides fast accurate positioning of the work-support table 16 along its respective X or Y axis and with respect to the point of insertion. Coordinate displacement drive system 26, 28 is controlled by computer controller 20 in a manner similar to conventional motor drive positioning systems commonly used in milling machines and metal lathes for controlling the position of a work-support table with respect to a cutter.

During operation of insertion machine 10, the X-axis drive system 26 and the Y-axis drive system 28 are selectively actuated, as necessary, by the computer controller following a prescribed order of positional data which effectively moves the point of insertion with respect to the circuit board (and work-support table 16) so that appropriate electronic components may be inserted in their proper openings of the PC board.

In addition to being movable along the X-axis and the Y-axis in the horizontal plane, the work-support table 16 is further preferably pivotal about a central point within the horizontal plane, as described in greater detail below.

Clinching assembly 18, in accordance with the invention is attached to frame 12 along the Z-axis and beneath work-support table 16 (and any secured PC board). Although clinching assembly 18 may be raised and lowered, as necessary during the insertion procedure, as is well known in the art, it is always positioned at the point of insertion, as described in greater detail below in the Clinching Assembly section below. The purpose of the clinching assembly, in accordance with this invention is to sense the presence of a lead through an opening of interest, cut excess lead material and clinch the remaining lead against the PC board.

B. Insertion Head Assembly

Figure 2:
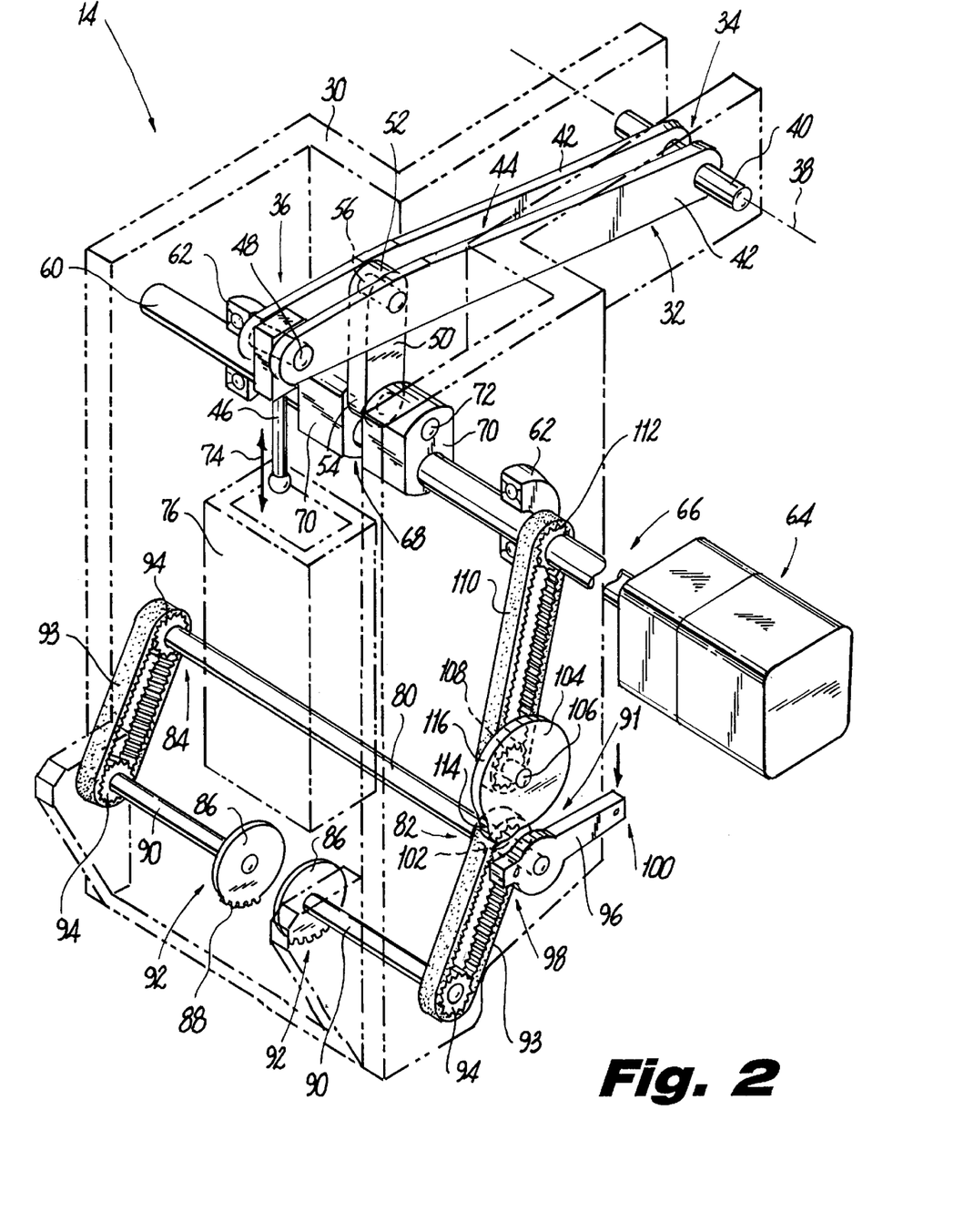
FIG. 2 is an isometric assembly view of a head assembly of the insertion machine, in accordance with the invention.
Figure 3:
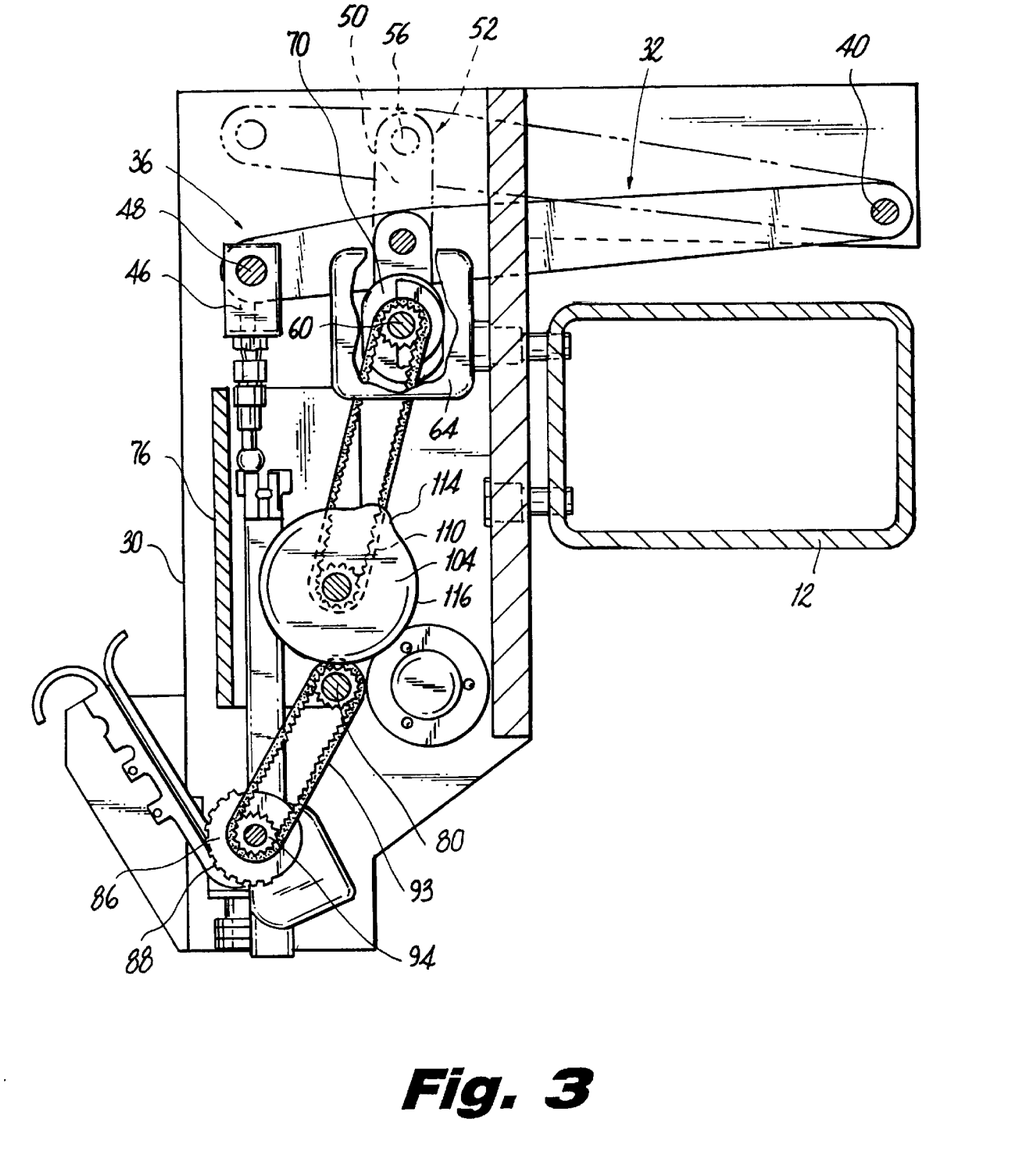
FIG. 3 is a side view of the head assembly of FIG. 2, in accordance with the invention.

Referring to FIGS. 2 and 3, insertion head assembly 14, in accordance with the invention is shown including a housing 30 (shown in phantom lines). Housing supports and protects the elements comprising head assembly 14. Primary lever 32 includes pivot end 34 and operative end 36. Pivot end 34 is pivotally attached to housing 30 along pivot axis 38 using pin 40 (or appropriate bolt or fastener). Primary lever 32 preferably includes two symmetrical, parallel, spaced lever arms 42, defining a space 44 located therebetween.

A reciprocating push rod 46 is attached to lever 32 at operative end 36. Push rod 46 is pivotally connected to both lever arms 42 within space 44 using an appropriate bolt of pin 48. A connecting rod 50 includes upper end 52 and lower end 54. Upper end 52 is attached to primary lever 32 at a point located between operative end 36 and pivot end 34. Connecting rod 50 is preferably attached to both lever arms 42, between space 44, using an appropriate pin or bolt 56.

A primary drive shaft 60 is rotatably supported by housing 30 using appropriate support bearings 62. Primary drive shaft 60 is preferably arranged perpendicular to and below the primary lever 32. A servo motor 64 is operatively connected to primary drive shaft 60, at a drive end 66. Primary drive shaft 60 includes a crank assembly 68, including two offset crank arms 70 and a crank axle 72. Lower end 54 of connecting rod 50 is pivotally connected to crank axle 72.

In operation of the insertion head assembly, rotation of motor 64 rotates primary drive shaft 60 which swings crank arms 70. Offset crank axle 72 and lower end 54 of connecting rod 50 swings around primary drive shaft 60, causing upper end 52 of connecting rod 50 to reciprocate up and down. The reciprocation of the connecting rod 50 is translated to primary lever 32 as angular displacement about pivot axis 38. The magnitude of the angular displacement is dependent on the length of connecting rod 50, the distance between primary drive shaft 60 and crank axle 72, and the distance between pivot axis 38 and pin 52 along primary lever 32.

The angular displacement of primary lever 32 translates to generally vertically-disposed reciprocation of push rod 46 at operative end 36, generally along the Z-axis. As motor 64 rotates, push rod 46 vertically reciprocates, as indicated by arrow 74 of FIG. 2. The magnitude of the throw of each reciprocation cycle of push rod 46 depends on the distance between pin 48 and pin 56, the length of connecting rod 50, the distance between primary drive shaft 60 and crank axle 72, and the distance between pivot axis 38 and pin 52 along primary lever 32.

The vertical reciprocation of push rod 74 is applied to operating an insertion tooling assembly 76. The particular details of insertion tooling assembly 76 have been omitted from this detailed description of the invention because the specific structure and operation of tooling assembly 76 is not considered necessary to understand the present invention. Insertion tooling assembly 76 may be conventional, as is well known in the art, such as the mechanism disclosed in U.S. Pat. No. 3,550,238 (hereby incorporated by reference).

Index drive shaft 80 is rotatably supported by housing 30 using appropriate bearings (not shown). Index drive shaft 80, which is preferably positioned parallel to and below primary drive shaft 60, includes a drive end 82 and a remote end 84.

The head assembly 14 further includes two index wheels 86, each of which include teeth 88 located around each respective circumference. The pitch of the teeth of each index wheel 86 is close to and preferably identical to the pitch of the supply tape so that the leads of adjacent electronic components engage with proper registration between adjacent teeth 88. As is known in the art, rotation of index wheels 86 advance the supply tape into insertion tooling assembly 76.

Each index wheel 86 is attached to secondary index drive shaft 90, at an inner end 92. The distance located between index wheels 86 is adjustable to accommodate different sized electronic components. Each secondary index drive shaft 90 is rotatably supported within housing 30, preferably parallel to index drive shaft 80. The index drive shaft 80 is coupled to each secondary index drive shaft 90 by a toothed belt 93 and respective toothed pulleys 94 so that rotational displacement of index drive shaft 80 causes direct and effectively simultaneous rotation of each secondary index drive shaft 90. The end result is that rotation of index drive shaft 80 indirectly controls the linear displacement of the supply tape entering head assembly 14.

Attached to drive end 82 of index drive shaft 80 is an output side of a directional clutch mechanism 91 (shown in FIG. 3) which is a well known ratcheting device used to limit input rotation to a particular direction (clockwise or counter-clockwise). Such a clutch mechanism is a commercially available item called a needle bearing/clutch manufactured for example, by the Torrington Company of Torrington Conn., part no. RCB-101416. Attached to an input side of directional clutch 91 is index drive lever 96 which includes an actuation end 98 and a spring bias end 100. A contact roller 102 is pivotally attached to index drive lever 96 at actuation end 98. Directional clutch 91 is adapted to drive index drive shaft 80 clockwise only when index drive lever 96 is angularly displaced in a clockwise direction. Counter-clockwise angular displacement of index drive lever 96 will not transmit through directional clutch 91 and therefore will not rotate index drive shaft 80.

Index cam wheel 104 includes selectively fixed shaft 106 and is rotatably mounted to housing 30 through a bearing (not shown). Rigidly attached to shaft 106 is a toothed pulley (a timing-type pulley) 108 so that rotation of toothed pulley 108 causes direct and immediate rotation of index cam wheel 104. Index cam wheel 104 is coupled to primary drive shaft 60 through toothed pulley belt 110 connected to pulley 108 and a similar pulley 112 attached to primary drive shaft 60.

Index cam wheel 104 includes cam lobe (or projection) 114 and is positioned adjacent to index drive lever 96 so that contact roller 102 rolls along peripheral edge 116 of index cam wheel 104. The relative position of cam lobe 114 with respect to shaft 106 is preferably quickly and easily adjustable in prescribed increments so that the exact moment an electronic component enters into a receiving area, insertion tooling assembly 76 can be appropriately synchronized.

In operation of head assembly 14, servo motor 64 is actuated by control signals from computer 20 to rotate a predetermined angular displacement counter-clockwise from top-dead-center (TDC: a point in the operating cycle where primary lever 32 is at its greatest distance from primary drive shaft 60) to a first point of end cycle (PEC). Once shaft 60 reaches the first PEC, as measured using conventional optical encoding technology, for example (located on shaft 60) and clinching has occurred, computer controller 20 commands servo motor 64 to reverse direction, clockwise past TDC to another predetermined point of angular displacement, a second point of end cycle. It is preferred that when primary drive shaft 60 is positioned at TDC, cam lobe 114 is located at its top dead center TDC so that contact roller 102 is located at the highest point (the point furthest from the center of cam wheel 104) of cam lobe 114 and that index drive lever 96 has pivoted a maximum magnitude.

Each time servo motor 64 rotates primary drive shaft 60 past TDC, cam lobe 114 forces contact roller 102 to pivot index drive lever 96 and rotate index drive shaft 80 a consistent and predetermined increment of rotational displacement. The rotational displacement of index drive shaft 80 is transmitted to each secondary drive shaft 90 by toothed belt 92 and causes index wheels 86 to rotate a predetermined degree of angular displacement, depending on the pitch of the supply tape. This prescribed displacement of index wheels 86 forces a single electronic component into the insertion tooling assembly 76, as described above.

When primary drive shaft 60 reaches either the first or second PEC, cam lobe 114 of index cam wheel 104 is located at end cycle points and index drive lever 96 is not pivoted. This prevents index wheels 86 from rotating and the supply tape therefore remains stationary. As primary drive shaft 60 rotates from TDC to either the first PEC or the second PEC, push rod 46 moves from an uppermost position to a lowermost position. As push rod 46 moves downwardly from the uppermost position to the lowermost position, an electronic component, which had been inserted into insertion tooling assembly 76 during the last TDC of primary drive shaft 60, is cut from the supply tape, formed (leads bent parallel to each other), and driven downwardly along the Z-axis into openings of the PC board located at the point of insertion.

C. Clinching Assembly

Figure 4:
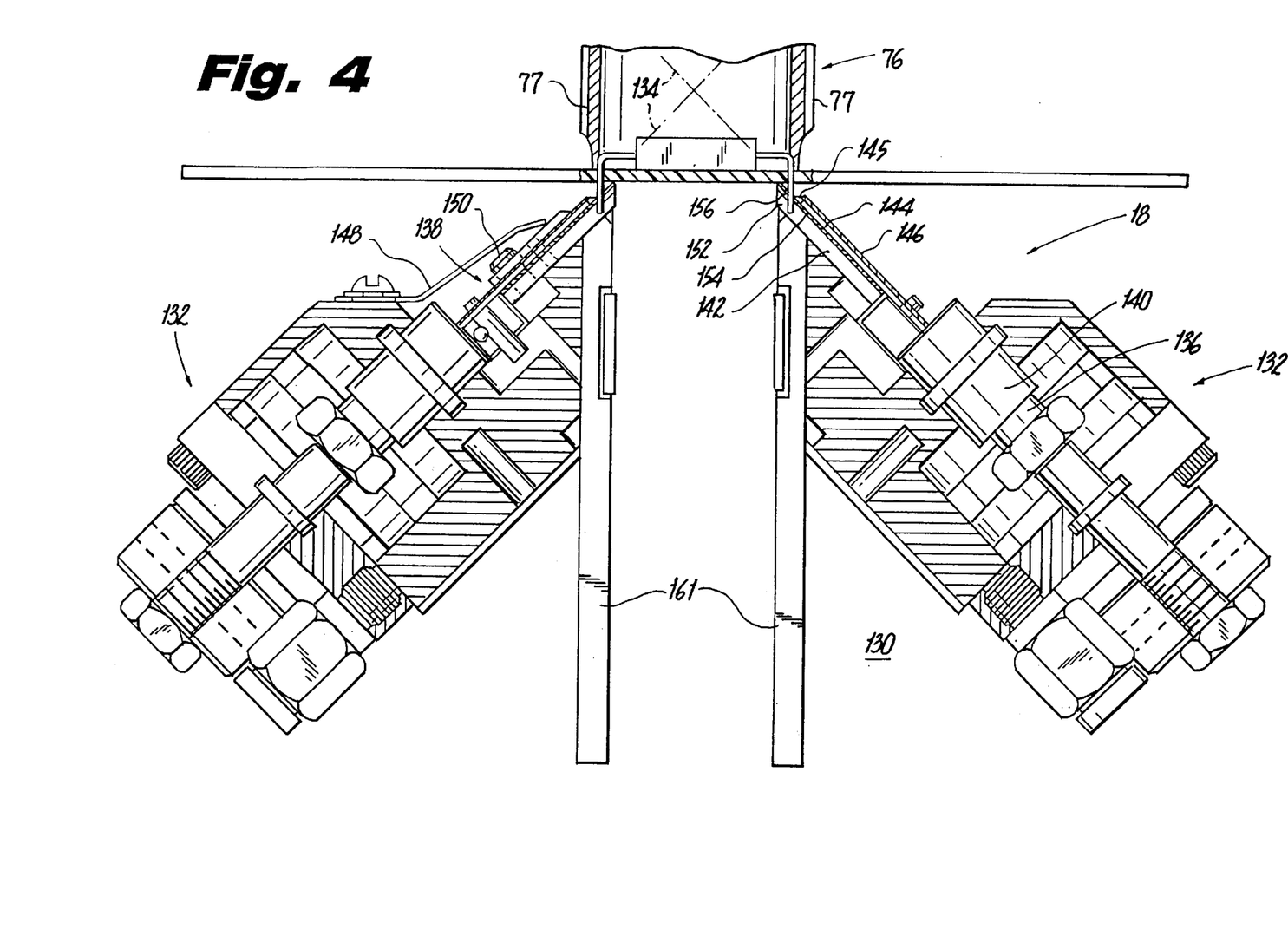
FIG. 4 is a partial sectional view of a clinching assembly of the insertion machine showing details of a lead-wire cutting assembly and a continuity lead-wire sensing system, in accordance with the invention.

Clinching assembly 18, introduced above is shown in FIGS. 4, 5, 6 and 7, and includes a height-adjustable base 130 which is secured to frame 12. Base 130 supports two actuators 132, one for each lead of the electronic component. Each actuator 132 operates along cutting axis 134 which is preferably approximately 45 arc degrees from the plane of the PC board (i.e., horizontal), as shown in FIG. 4. Each actuator 132 includes a piston assembly 136, and cutting assembly 138. Piston assembly 136 operates using varying air pressure on one side of piston 136 to move an actuator rod 140 between a lead-receiving position and a lead-cutting position (FIG. 4 shows piston 136 and actuator rod 140 in a lead-receiving position). Actuator 132 may be of a conventional design and may operate pneumatically, hydraulically, electromagnetically, or purely mechanically, as is known in the art.

In accordance with the invention, cutting assembly 138 (only one of the two identical cutting assemblies used) includes fixed knife plate 142, slidable cutting blade 144, an upper support plate 146 and bias-spring 148. Referring to FIG. 4, fixed knife plate 142 is positioned along cutting axis 134 (of either actuator 132) and is attached to actuator 132, using shoulder-bolts 150.

Figure 5A:
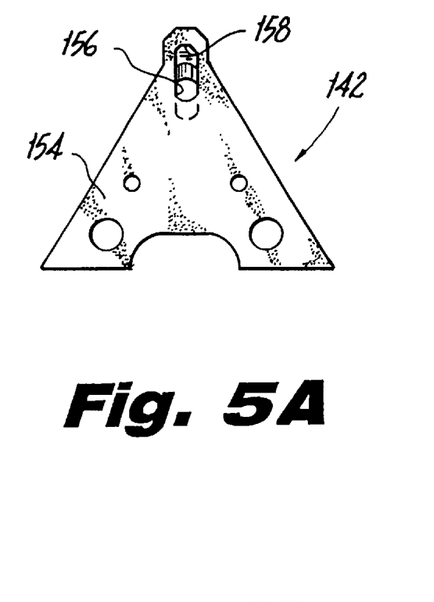
FIG. 5A is a plan view of a fixed knife plate of the clinching assembly, in accordance with the invention.
Figure 5B:
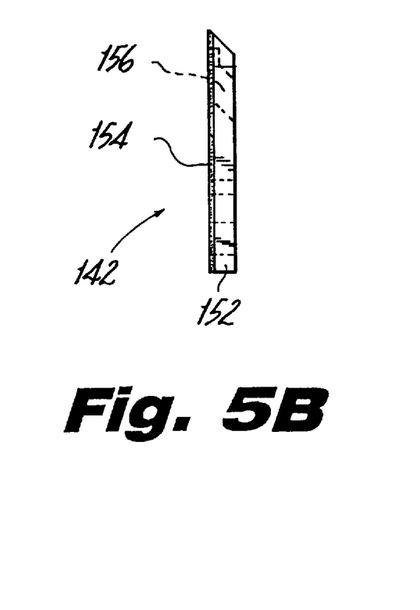
FIG. 5B is a side view of the fixed knife plate of FIG. 5A.
Figure 6A:
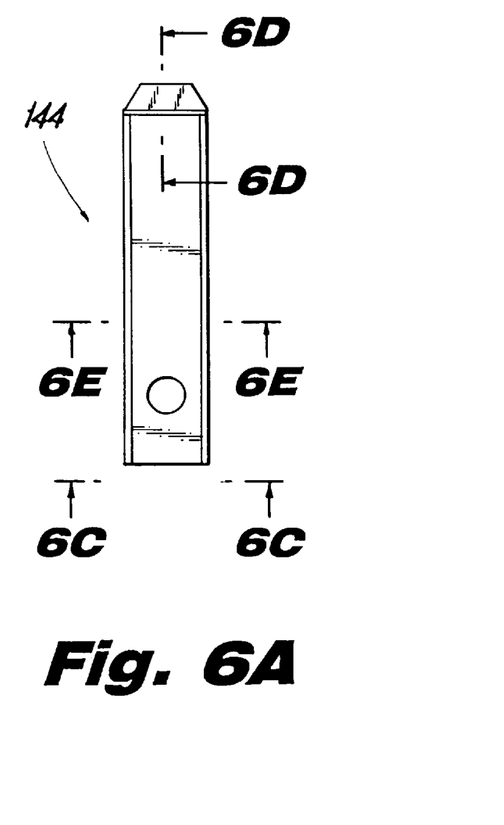
FIG. 6A is a plan view of a knife blade of the clinching assembly, in accordance with the invention.
Figure 6B:
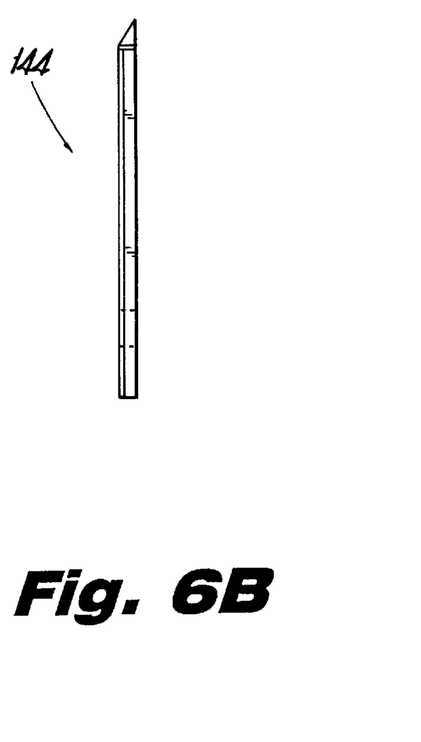
FIG. 6B is a side view of the knife blade of FIG. 6A, in accordance with the invention.
Figure 6C:
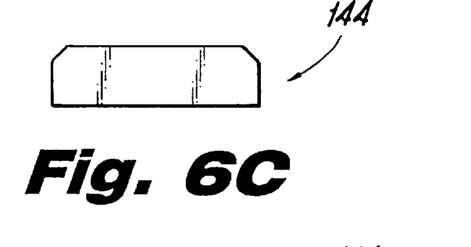
FIG. 6C is a bottom view of the knife blade of FIG. 6B, in accordance with the invention.
Figure 6D:
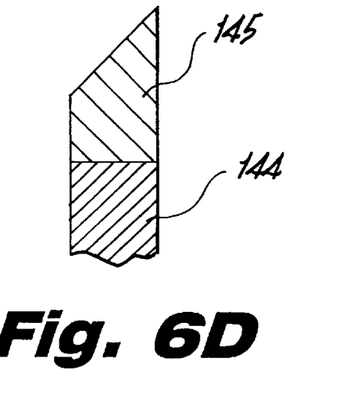
FIG. 6D is a section side view of the tip of the knife blade of FIG. 6B, in accordance with the invention.
Figure 6E:
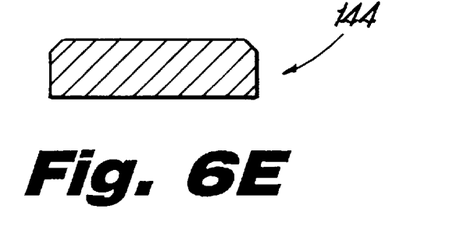
FIG. 6E is section view of a shaft portion of the knife blade, taken along the lines 6E—6E of FIG. 6A.

Referring to FIGS. 4 and 5, fixed knife plate 142 includes conductive metal base layer 152 and a thin insulation (non-conductive) layer 154, preferably made from zirconia. The preferred grade of zirconia is Z201N, available from TDK Corporation or Kyocera Corporation, both of Japan. However, (any hard, insulative material could be used including many types of ceramic based materials. Base layer 152 includes a cutting slot 156 which receives a lead to be cut and clinched. Fixed knife plate 142 remains stationary with respect to frame 12 during the entire cutting and clinching procedure.

Referring to FIGS. 4 and 6, slidable knife blade 144 is slidably mounted to fixed knife plate 142 (adjacent to insulation layer 154) and is directly attached to actuator rod 140. Knife blade 144 is movable along cutting axis 134 from the lead-receiving position to the lead-cutting position, wherein the lead wire is first cut, then clinched, as described below. Slidable knife blade 144 includes a small body width which is sized and shaped to slide within channel 153 formed within the upper support plate 146 so that knife blade 144 may freely slide between the lead-receiving position and the lead-cutting position. Knife blade 144 includes knife tip 145 which preferably is made of tungsten carbide and is brazed onto knife blade 144. Alternatively, knife tip 145 may be of the same material as the body of knife blade 144 (preferably tool steel).

Figure 7A:
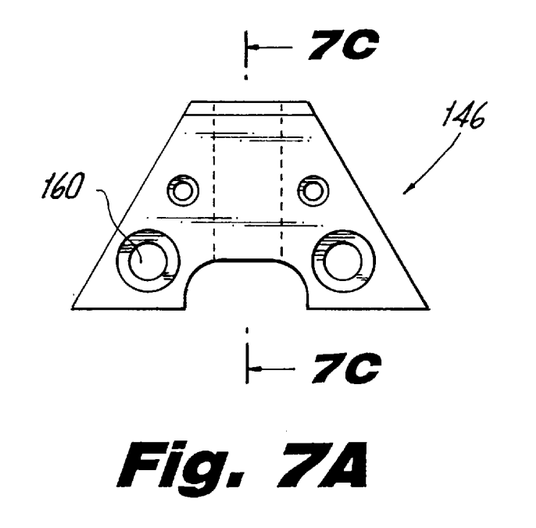
FIG. 7A is a plan view of an upper support plate of the clinching assembly, in accordance with the invention.
Figure 7B:
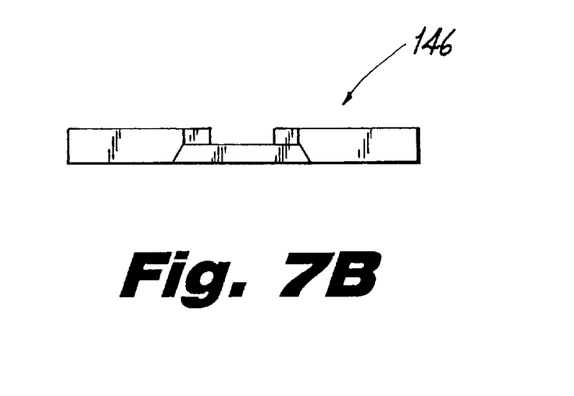
FIG. 7B is a top view of the upper support plate, in accordance with the invention.
Figure 7C:
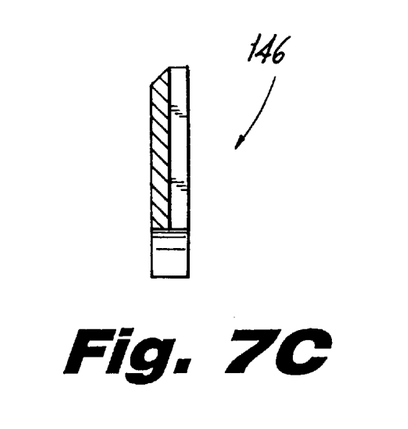
FIG. 7C is a side view of the upper support plate, in accordance with the invention.

Referring to FIGS. 4 and 7, upper support plate 146 is secured on top of knife blade 144 to provide support to knife blade 144 during cutting and clinching. Upper support plate 146 includes two openings 160 for receiving shoulder bolts 150. Upper support plate 146 remains stationary with respect to the fixed knife plate 142 during the cutting and clinching procedure.

Bias-spring 148 is a plate-type spring and is secured to a portion of actuator 132. An open end of spring 148 pushes downwardly against an upper portion of support plate 146 thereby pushing support plate 146 against knife blade 144. Knife blade 144 is slidably guided between fixed knife plate 142 and upper support plate 146.

In operation of clinching assembly 18, base 130 is automatically lowered during or before movement of the PC board and raised during or after insertion using a pneumatic cylinder (or other actuator) to receive the lead wires of an electronic component being inserted into the PC board. Insertion tooling assembly 76 includes electronic component insertion arms 77 which contact and drive the leads of a component into openings of a PC board, a signal is sent to valve a predetermined amount of pressurized air through conduit (not shown) to actuators 132. The applied air moves respective pistons 136 along cutting axis 134 forcing knife blade 144 to move from the lead-receiving position, shown in FIG. 4 to the lead cutting position (not shown). As knife blade 144 slides along cutting axis 134, its forward cutting edge eventually contacts a lead which is located within slot 156. The lead is first pushed along the cutting axis 134 until it abuts against a forward edge 158 of slot 156, at which point the metallic lead makes electrical contact with a conductive portion of slot 156, in particular base 154. As knife blade 144 continues to slide along axis 134 the metallic lead is cut by the pinching action of the cutting edge on blade 144 and the forward edge 158 of slot 156. After the lead is cut, the scrap falls away, preferably into scrap tube 161 and is removed under vacuum from clinching assembly 18.

Knife blade 144 continues to push against the lead after it has been cut, causing it to bend and clinch against the bottom of the PC board. After blade 144 has clinched the component lead, air pressure is released, and blade 144 retracts to the lead receiving position.

During initial insertion by insertion tooling assembly 76, isolated electrical contact is made between each of the two insertion arms 77 and each of the two leads of the electronic component, respectively. A simple continuity test is made once the lead of the electronic component is pushed into contact with the base 152 of the fixed knife plate 142. Each lead of a single component is used just prior to the cutting and clinching procedure to close a circuit between respective insertion arms 77, located above the PC board, and respective conductive base layers 152 of the knife plates 142, located below the PC board.

If either lead failed to properly pass through its proper opening of the PC board, the continuity test circuit will remain electrically "open" and will indicate an alarm signal to computer 20 to take appropriate action, such as shut down the entire machine to safely allow human personnel to manually insert or replace the damaged (or missing) electronic component.

A simple continuity circuit, as is well known in the art is applied between each insertion arm 77 and each respective knife plate 142 wherein the interposed component lead functions as the "closing switch" to the test circuit. Knife plate 142 is otherwise electrically insulated from either insertion arm 77 so that if no lead is present to close the test circuit, an alarm signal is effectively sent to computer 20. If a lead is present, no alarm is sent.

Figure 11:
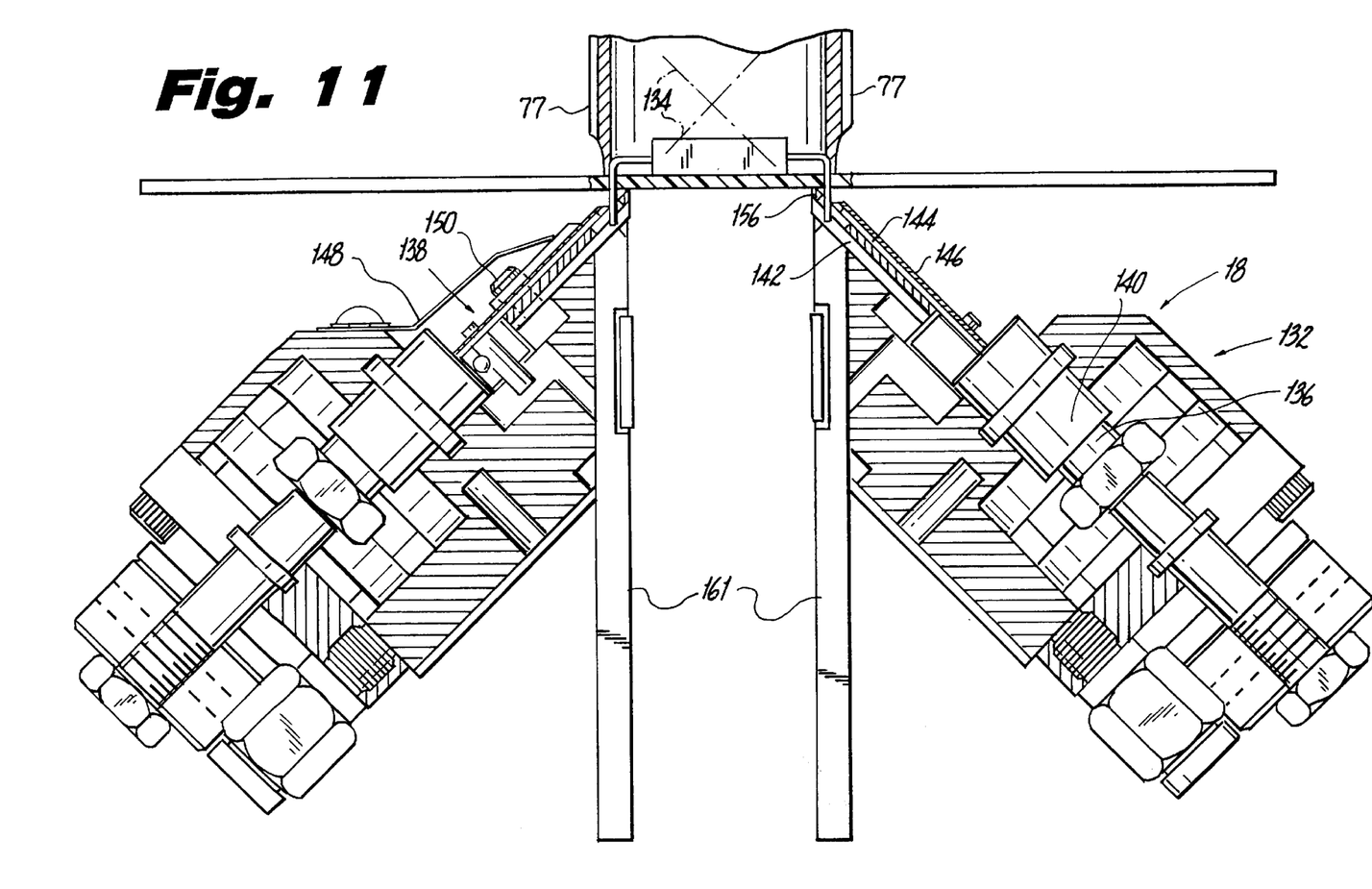
FIG. 11 is a partial sectional view of a clinching assembly of the insertion machine showing details of an alternative lead-wire cutting assembly and a continuity lead-wire sensing system.
Figure 12:
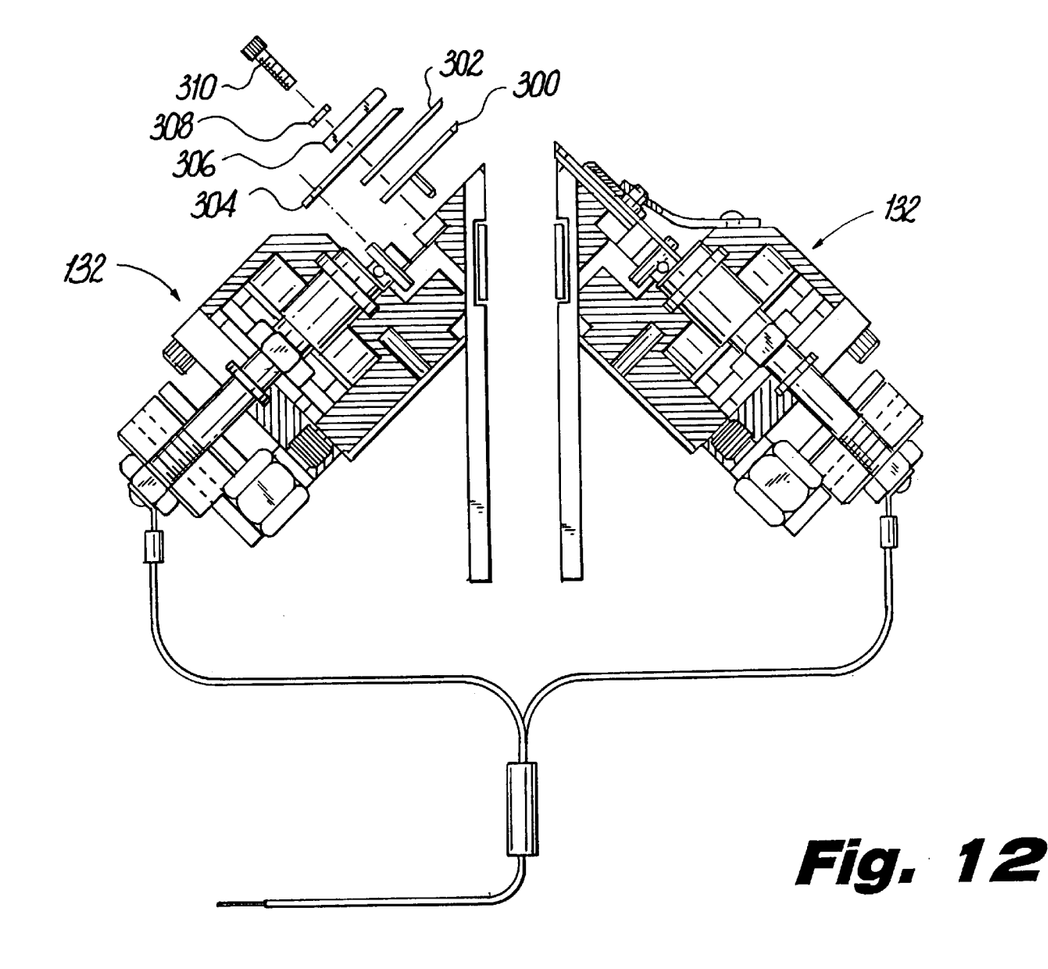
FIG. 12 is a partial sectional, partial exploded view of the clinching assembly of FIG. 11.

Referring to FIGS. 11 and 12 an alternative, and preferred, continuity testing arrangement is shown. In this arrangement, the continuity circuit is completed between a conductive fixed knife base and a electrically insulated conductive moving knife, when the moving knife contacts and pushes a component lead against the edge of the conductive fixed knife base. In this embodiment, the insertion tooling is excluded from the continuity circuit. One problem with the use of the insertion tooling as an electrical contact is the presence of non-conductive material at the part of the lead closest to the component. During manufacture of the component material can be deposited on the lead. The material can form a trail along the lead which can interfere with the conductivity of the lead and can result in a false continuity reading.

Thus, referring to FIG. 12, electrically conductive fixed knife base 300 is mounted to actuator 132. Non-conductive fixed knife 302 is mounted to fixed knife base 300. Knife 302 and base 300 each have a slot through which a component lead may be introduced (as shown in FIG. 5 with respect to another embodiment). Non-conductive knife 302 is made of a hard non-conductive material capable of forming a cutting edge for cutting component leads. Suitable materials are described above with respect to layer 154 of knife plate 142.

Conductive moving knife 304 is mounted over fixed knife 302 and is slidably secured by moving knife retainer 306. Insulative washer 308 (made of rubber or other suitable insulative material) electrically isolates conductive moving knife 304 from actuator 132 when retaining bolt 310 is used to bolt moving knife retainer 306 to actuator 132.

In operation, the presence or absence of the component lead is detected as moving conductive knife 304 advances and pushes the component lead against the edge of the conductive fixed knife base 300 and the continuity circuit is completed.

D. Work-Support Table

Figure 8:
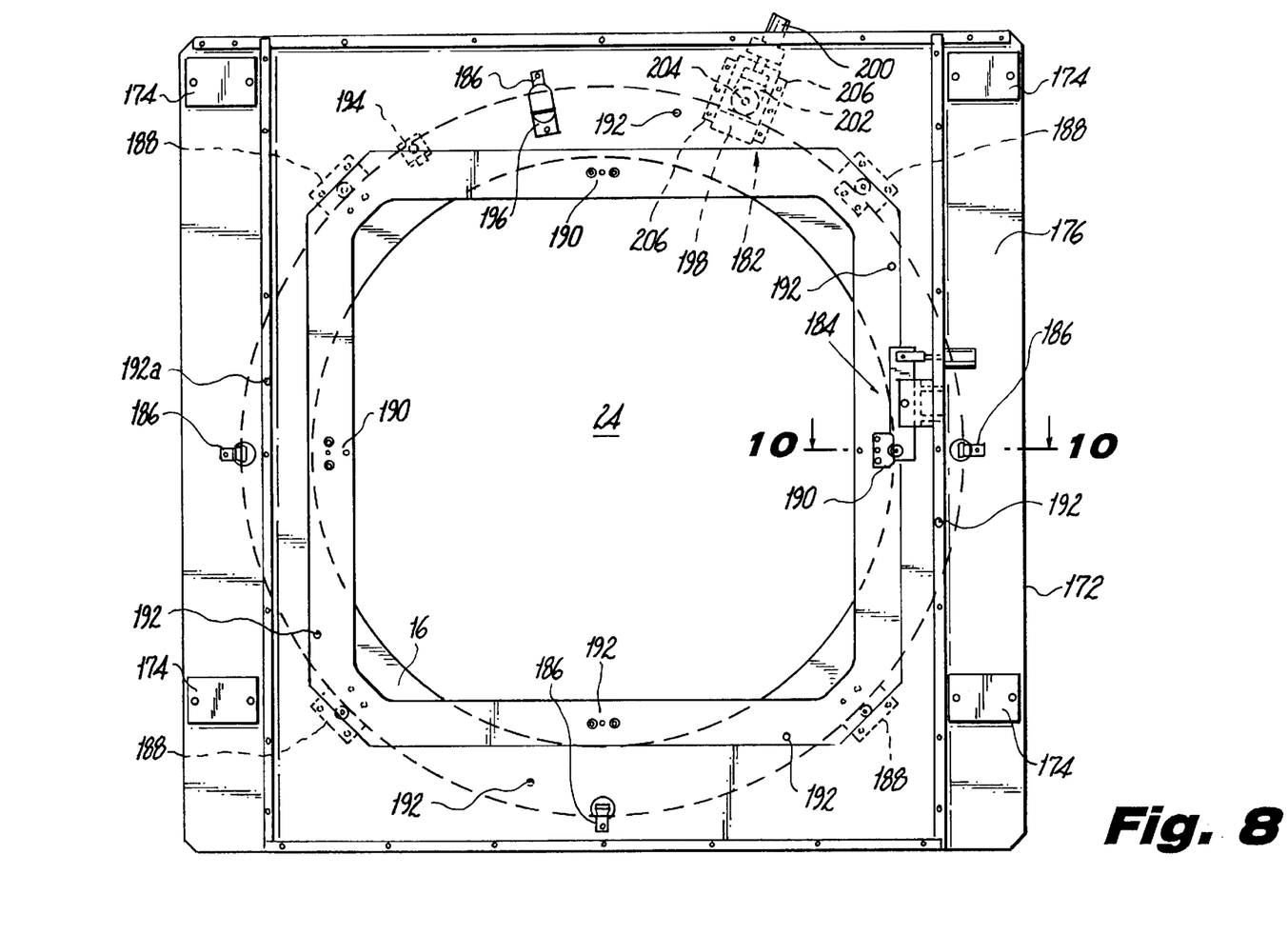
FIG. 8 is a plan view of the underside surface of a rotatable table assembly of the insertion machine, in accordance with the invention.
Figure 9:
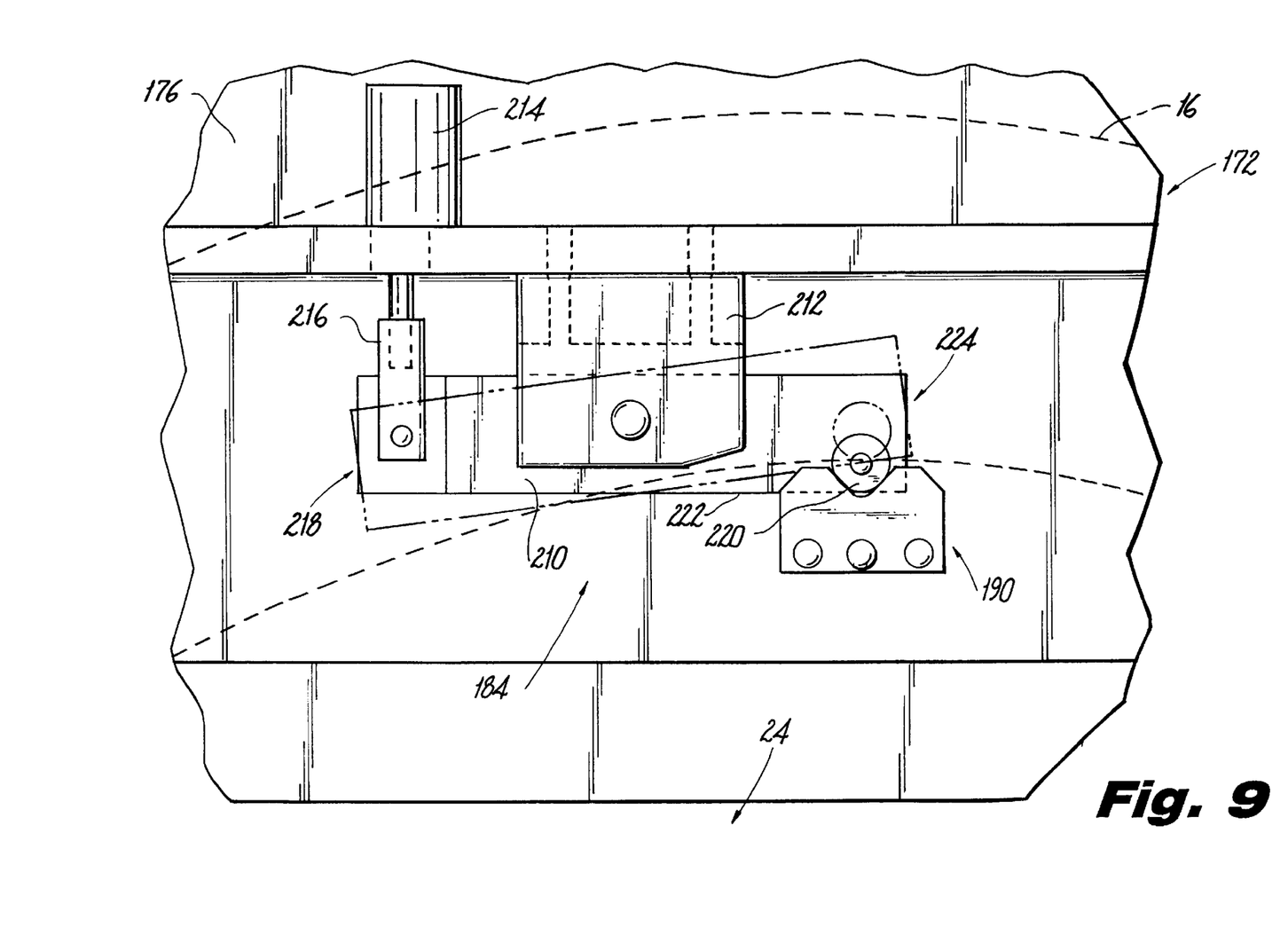
FIG. 9 is a partial plan view of a locking assembly of the rotatable table assembly, in accordance with the invention.
Figure 10:
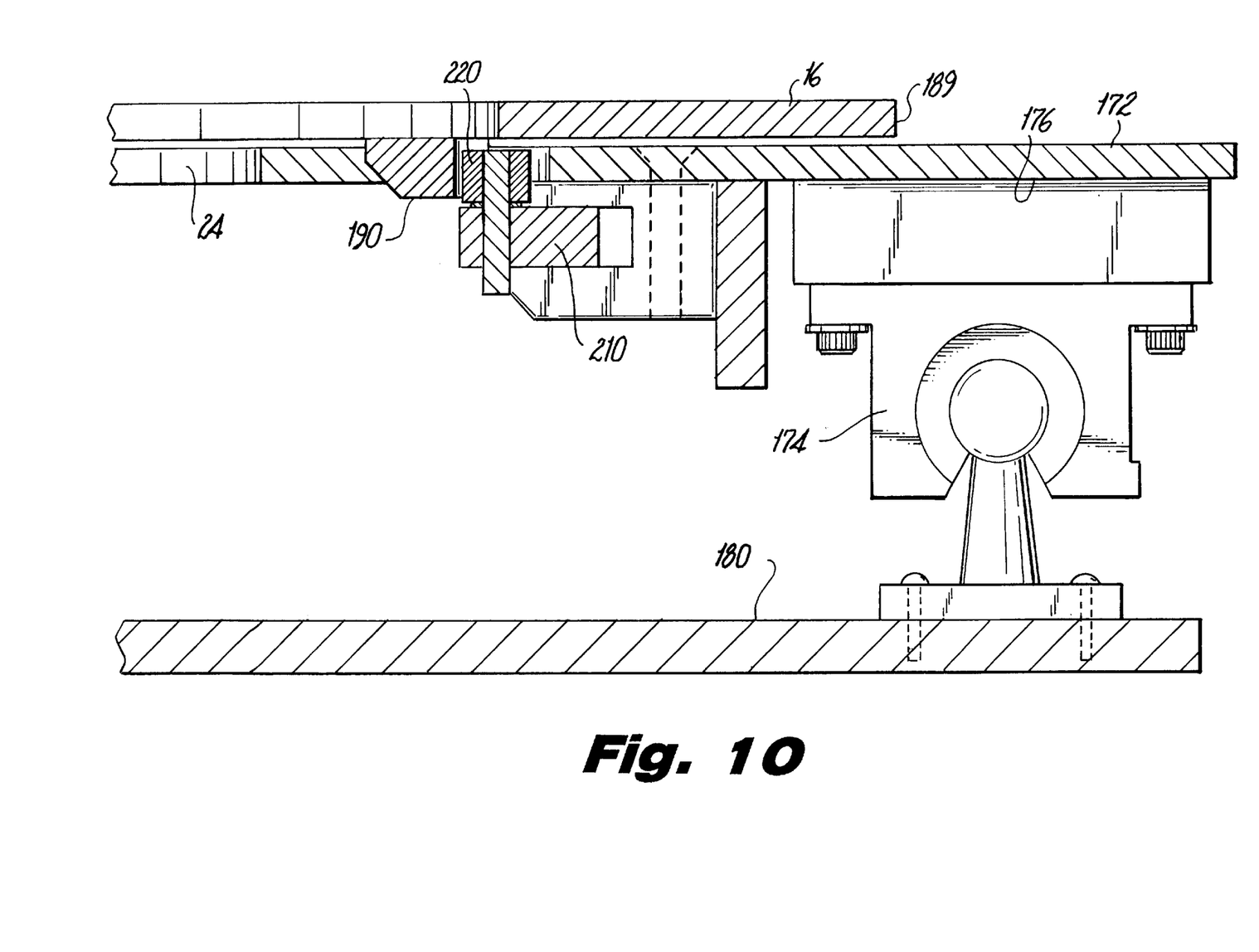
FIG. 10 is a partial sectional view of the locking assembly of the rotatable table assembly, taken along the lines 10—10 of FIG. 8.

Work-support table 16, in accordance with the invention, and introduced above is shown in FIGS. 8, 9 and 10 and is attached to a conventional X-Y axis displacement assembly (not shown, but described above).

Referring to FIGS. 1 and 8, work-support table 16 (hereinafter "table" 16) is a flat circular disc of a rigid material, such a metal. Table 16 is rotatably mounted within an circular opening 170 of a Y-stage 172. Y-stage 172 is a flat rectangular table which includes threaded blocks 174 along an underside surface 176 which engage with lead screws 178. Servo motors (not shown) rotate lead screws 178 to move both Y-stage 172 and table 16 linearly, along a Y-axis direction (usually front to back with respect to the machine 10), as shown in FIG. 1C.

The entire Y-stage 172 is slidably mounted to an upper surface of an X-stage 180. X-stage 180 operates in a similar manner, as is known in the art, to move both the Y-stage 172 and table 16 in along an X-axis (usually in a side to side direction with respect to machine 10), as shown in FIG. 1C.

Referring to FIG. 8, an underside surface 176 of Y-stage 172 is shown including a friction drive assembly 182, a locking assembly 184, vertical support bearings 186, lateral support bearings 188, detent blocks 190 and a position-sensing assembly including peripheral openings 192 located through the table 16 and two photo-couplers 194, 196, respectively.

Each vertical support bearing 186 and lateral support bearing 188 includes a roller bearing and a bracket. Each bracket is mounted to underside surface 176 of Y-stage 172 so that a contact portion of each vertical support bearing 186 contacts the underside surface of table 16 while a contact portion of each lateral support bearing 188 contacts an edge surface 189 of table 16, depending on the type of bearing used, as is well known in the art.

Friction drive assembly 182 includes a slidable mounting plate 198 which supports an air cylinder 200, a servo motor 202 and a friction wheel 204. Slidable mounting plate 198 is slidably mounted to the underside 176 of table 16 using rails 206 so that the friction wheel 204 may be selectively moved between a disengaged and an engaged position, as described below. An opening (not shown) is provided through Y-stage 172 through which friction wheel 204 protrudes so that when friction wheel 204 is selectively moved by air cylinder 200 (or other actuator) to the engaged position, it contacts (frictionally engages) the edge surface 189 of table 16.

Referring to FIGS. 8, 9, and 10, locking assembly 184 includes rocking lever 210 which is pivotally mounted to a pivot bracket 212 and is pivotal between unlocked and locked positions. An actuator 214 is attached to Y-stage 172 and includes actuator arm 216 which is attached to actuation end 218 of rocking lever 210. Cam follower 220 is rotatably mounted (along a vertical axis) along an inward edge 222, adjacent to an opposing engagement end 224. In operation, as actuator 214 is activated (preferably pneumatically), rocking lever 210 is pulled at actuation end 218 which causes rocking lever 210 to pivot engagement end 224 inwardly towards the center of table 16. Cam follower 220 is sized and shaped to snugly fit within a detent block 190 and hold table 16 in a predetermined orientation. Actuator 214 is only actuated when any of the preferably four detent blocks 190 are in alignment with cam follower 220, as described below.

During the insertion process, as is understood by those in the art, it is often necessary to rotate table 16 (and the PC board) to accommodate oriented electronic components (usually in 90 degree increments). To initiate a rotation of table 16, computer 20 signals actuator 214 to disengage cam follower 220 and simultaneously engages friction wheel 204 of friction drive assembly 182 into contact with edge 189 of table 16. Friction drive assembly 182 rotates table 16 about its center point, guided by vertical and lateral support bearings 186, 188, respectively.

During an orientation change of table 16 (e.g. moving table 16 from a "home" reference point of zero degrees to 90 arc degrees), air cylinder 200 operates to cause at a first high rate of rotation which causes table 16 to initially rotate quickly. However, to ensure a detent block 190 can be "captured" by locking assembly 184, table 16 must slow to a second slower rate of rotation.

To inform computer 20 the position of table 16 during rotation, peripheral openings 192 are positioned along the periphery of table 16 and selectively communicate with both photo-couplers 194 and 196, as they pass by and open or block the respective light beams thereof. Referring to FIG. 8, as table 16 rotates in a clockwise direction, from a "home" position (Table 16 is shown in the "home" position in FIG. 8 because a peripheral opening 192 has aligned with both photo-couplers simultaneously) which represents a zero degree starting position, to a 90 degree position, opening 192A moves clockwise (at an initial high rate of rotation). When it passes photo-coupler 194 a signal is sent to computer 20 which then slows down servo motor 200 to a slower rate of rotation. As opening 192A continues to move from photo-coupler 194 to photo-coupler 196, now at a slower rate, computer 20 is ready to activate actuator 214, the instant photo-coupler 196 detects the opening 192A, at which point cam follower 220 will be moved into the engaged position and will "catch" and lock a now aligned detent block. Sensors not shown indicate the position of lock assembly 184. Once cam follower 220 engages detent block 190, an engaged signal is sent to computer 20. Friction drive motor 200 is deactivated once photo-coupler 196 detects opening 192. Table 16 is locked in a 90 degree orientation from the "home" position.

What is claimed is:

1. An insertion machine for forming and inserting lead wires of an electronic component, along an insertion axis, into openings of a printed circuit board, said machine comprising:

a frame;

a head assembly adapted to receive an electronic component, said head assembly having a primary lever having a hinging end and a free end, said hinging end being pivotally attached to said frame along a hinging axis, said free end being located substantially along said insertion axis, said primary lever being pivotal about said hinging axis so that said free end is displaceable substantially along said insertion axis between a raised and lowered position;

means for inserting said lead wires into said openings of said circuit board, the force for insertion being provided by the displacement of said free end between said raised and lowered position; and means for pivoting said lever about said hinging axis so that said free end is displaced substantially along said insertion axis, between said raised and lowered positions said pivoting means including a primary shaft having a crank and a connecting rod, said primary shaft being rotatably mounted to said frame along a primary shaft axis, said primary shaft being generally parallel to said hinging axis said primary shaft supporting said crank and defining an offset connection point a predetermined distance from said shaft axis, said connecting rod being connected to said connection point and said primary lever so that as said crank rotates, said connecting rod reciprocates and forces said primary lever to pivotally move about said hinging axis.

2. The insertion machine according to claim 1, further comprising means for feeding said electronic component from a supply to said insertion means, said feeding means being responsive to rotation of said primary shaft.

3. The insertion machine according to claim 2, wherein said feeding means comprises an index drive shaft and index wheels, said index wheels being adapted to engage said lead wires of electronic components and sequentially feed said electronic components to said insertion means, said index drive shaft being rotatably mounted to said frame, said feeding means further comprising means for intermittently rotating said index drive shaft so that said index wheels intermittently rotate and sequentially feed said electronic components to said insertion means.

4. The insertion machine according to claim 3 wherein said intermittently rotating means is responsive to rotation of said primary shaft.

5. The insertion machine according to claim 3, wherein said intermittently rotating means includes a cam defining a cam lobe, a lever and a ratcheting mechanism, said lever being attached to said index drive shaft through said ratcheting mechanism so that rotation of said lever about said index drive shaft rotates said index drive shaft, said cam being rotatably mounted to said frame so that said cam lobe intermittently connects said lever and rotates said lever and said index drive shaft, said intermittently rotating means further including means for rotating said cam in response to said rotation of said primary shaft.

6. The insertion machine according to claim 5, further comprising a drive connection mechanically connecting said primary shaft with said cam so that rotation of said primary shaft rotates said cam through said drive connection.

7. The insertion machine according to claim 1, wherein said primary shaft is rotated by an electric servo motor mechanically attached to said primary shaft.

8. An insertion machine for forming and inserting lead wires of an electric component at an insertion point, into openings of a printed circuit board, said machine comprising:

a frame;

a head assembly adapted to receive an electronic component, said head assembly including a primary lever having a hinging end and a free end, said hinging end being pivotally attached to said frame along a hinging axis, said primary lever being pivotal about said hinging axis so that said free end is selectively displaced along an insertion path between a raised and lowered position;

an electric motor having an output shaft connected to an offset crank assembly;

a connecting rod attached between said primary lever and said offset crank so that rotation of said output shaft causes said connecting rod to reciprocate and mechanically displace said primary lever about said hinging axis between said raised position and said lowered position; and an insertion mechanism for inserting said lead wires into said openings of said circuit board as said primary lever moves from said raised position to said lowered position.

\* \* \* \* \*